US010429908B2

(12) United States Patent
Delano et al.

(10) Patent No.: US 10,429,908 B2
(45) Date of Patent: Oct. 1, 2019

(54) BLACK BODY RADIATION IN A COMPUTING DEVICE

(71) Applicant: Microsoft Technology Licensing, LLC, Redmond, WA (US)

(72) Inventors: Andrew Douglas Delano, Woodinville, WA (US); Aaron Albert Oro, Menlo Park, CA (US); Kanth Kurumaddali, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/083,285

(22) Filed: Mar. 28, 2016

(65) Prior Publication Data
US 2017/0277235 A1    Sep. 28, 2017

(51) Int. Cl.
*G06F 1/20* (2006.01)
*H05K 7/20* (2006.01)
(Continued)

(52) U.S. Cl.
CPC ............ *G06F 1/206* (2013.01); *G06F 1/1601* (2013.01); *G06F 1/203* (2013.01); *H01L 23/427* (2013.01);
(Continued)

(58) Field of Classification Search
CPC .................... G06F 1/20; G06F 1/203
(Continued)

(56) References Cited

U.S. PATENT DOCUMENTS 6,025,991 A    2/2000 Saito
6,819,559 B1   11/2004 Seeger et al.
(Continued)

FOREIGN PATENT DOCUMENTS

CN    203243659 U    10/2013
EP    2282607 A1    2/2011
(Continued)

OTHER PUBLICATIONS

Galloway, Jesse E., "Thermal analysis of portable electronic products", In Proceedings of the Sixth Intersociety Conference on Thermal and Thermomechanical Phenomena in Electronic Systems, May 27, 1998, pp. 1-7.
"International Search Report and Written Opinion Issued in PCT Application No. PCT/US2017/023493", dated Jan. 25, 2018, 17 Pages.

*Primary Examiner* — Zachary Pape
(74) *Attorney, Agent, or Firm* — Ray Quinney & Nebeker P.C.; Paul N. Taylor (57) ABSTRACT

Thermal management systems are described herein. A thermal management system includes components of a computing device. The computing device includes a housing. The housing includes an inner surface. A portion of the inner surface of the housing has a first emissivity. The computing device also includes a thermal management device positioned within the housing, at a distance from the portion of the inner surface of the housing. The thermal management device includes an outer surface. The outer surface of the thermal management device includes a first portion and a second portion. The first portion of the outer surface of the thermal management device has a second emissivity, and the second portion of the outer surface of the thermal management device has a third emissivity. The second emissivity is greater than the third emissivity, and the first emissivity is substantially the same as the second emissivity.

21 Claims, 5 Drawing Sheets

(51) Int. Cl.
*G06F 1/16* (2006.01)
*H01L 23/427* (2006.01)
*H01L 23/467* (2006.01)

(52) U.S. Cl.
CPC ....... *H01L 23/467* (2013.01); *H05K 7/20336* (2013.01); *H05K 7/20427* (2013.01); *H05K 7/20436* (2013.01); *H05K 7/20709* (2013.01)

(58) Field of Classification Search
USPC .................. 361/679.46–679.54, 688–723
See application file for complete search history.

(56) References Cited

U.S. PATENT DOCUMENTS

| | | | |
|---|---|---|---|
| 7,135,357 B2 | 11/2006 | Yu et al. | |
| 7,420,810 B2 * | 9/2008 | Reis | C09K 5/041 165/104.26 |
| 7,468,582 B2 * | 12/2008 | Kim | H05K 7/20963 313/46 |
| 7,705,536 B2 * | 4/2010 | Yanagawa | H05K 7/20963 313/582 |
| 7,710,725 B2 * | 5/2010 | Takakusaki | G06F 1/1616 165/104.33 |
| 8,085,534 B2 * | 12/2011 | Ogiro | H05K 7/20963 248/918 |
| 9,091,425 B2 | 7/2015 | Juy et al. | |
| 2005/0077822 A1 | 4/2005 | Kim et al. | |
| 2006/0028621 A1 | 2/2006 | Gupta et al. | |
| 2008/0062651 A1 | 3/2008 | Reis et al. | |
| 2008/0310119 A1 | 12/2008 | Giacoma | |
| 2013/0167834 A1 * | 7/2013 | Kuo | F28D 15/06 126/635 |
| 2013/0333864 A1 | 12/2013 | Chen | |
| 2014/0069622 A1 | 3/2014 | Chen et al. | |
| 2014/0272217 A1 | 9/2014 | Weber et al. | |
| 2017/0049006 A1 * | 2/2017 | McLaughlin | H05K 7/20336 |

FOREIGN PATENT DOCUMENTS

| | | |
|---|---|---|
| EP | 2602291 A2 | 6/2013 |
| JP | 2005150429 A | 6/2005 |

* cited by examiner

BLACK BODY RADIATION IN A COMPUTING DEVICE

BRIEF DESCRIPTION OF THE DRAWINGS

For a more complete understanding of the disclosure, reference is made to the following detailed description and accompanying drawing figures, in which like reference numerals may be used to identify like elements in the figures.

While the disclosed devices, systems, and methods are representative of embodiments in various forms, specific embodiments are illustrated in the drawings (and are hereafter described), with the understanding that the disclosure is intended to be illustrative, and is not intended to limit the claim scope to the specific embodiments described and illustrated herein

DETAILED DESCRIPTION

Current microprocessor design trends include designs having an increase in power, a decrease in size, and an increase in speed. This results in higher power in a smaller, faster microprocessor. Another trend is towards lightweight and compact electronic devices. As microprocessors become lighter, smaller, and more powerful, the microprocessors also generate more heat in a smaller space, making thermal management a greater concern than before.

The purpose of thermal management is to maintain the temperature of a device within a moderate range. During operation, electronic devices dissipate power as heat that is to be removed from the device. Otherwise, the electronic device will get hotter and hotter until the electronic device is unable to perform efficiently. When overheating, electronic devices run slowly and dissipate power poorly. This can lead to eventual device failure and reduced service life.

As computing devices get smaller (e.g., thinner), thermal management becomes more of an issue. Heat may be dissipated from a computing device using forced and natural convection, conduction, and radiation as a way of cooling the computing device as a whole and a processor operating within the computing device. Radiative heat transfer from the processor (and/or thermal management devices adjacent to or in physical contact with the processor) to a housing (e.g., an underside of a touch display module) of the computing device aids in the removal of heat from the processor.

The rate at which heat is transferred radiatively between two adjacent surfaces is primarily dependent on the sum of the surface and geometric resistances (e.g., total resistance) and the temperature difference between the two surfaces. The larger the temperature difference, the greater the heat dissipation. The smaller the total resistance, the greater the heat dissipation. Due to the distance between the two adjacent surfaces within the thin computing device being so small, the total resistance is significantly influenced by the emissivity of each surface. The resistance is significantly reduced when both surfaces have high emissivity, as the resistance is a function of the relative properties of both surfaces. If one of the adjacent surfaces has low emissivity, radiative heat transfer between the two surfaces is negligible.

Emissivity is a specific property of material and ranges from 0 to 1, with 0 being, for example, a complete white, reflective body, and 1 being, for example, a black absorbative body. Copper, aluminum, and other highly thermally conductive materials, of which thermal management devices such as, for example, heat spreaders, heat pipes, vapor chambers, and heat sinks are made, have low emissivities (e.g., aluminum, 0.03; copper, 0.04). Aluminum and other lightweight metal materials are used for touch display modules and/or computing device housings to reduce weight. Use of these materials for the touch display module and/or the housing and the thermal management devices provides a low radiative heat transfer efficiency between the thermal management devices and the touch display module and/or the housing. In such cases where these metals are used in natural form, radiative heat transfer within the computing device is an insignificant factor in the heat removal from the processor, for example.

Disclosed herein are apparatuses, systems, and methods for improved radiative heat dissipation from an electronic device. The improved heat dissipation within an electronic device may be provided by coating layers of a high emissivity, such as black paint, applied to one or more thermal management devices and/or other components within the computing device, and an inner surface of the computing device housing (e.g., formed by the touch display module). The black coating layers may be applied to surfaces of the thermal management devices and/or the other components within the computing device facing the inner surface of the computing device housing. As an example, a black coating layer may be applied to a fan housing, a phase change device (e.g., a heat pipe), a heat spreader, a shield, and a surface of the touch display housing. The black coating layers may be layers of black paint, black tape, physical vapor deposition, chemical vapor deposition, anodization, another black coating layer, or any combination thereof.

The black coating layers have an emissivity of approximately 1 (e.g., 0.95-0.99). Emissive material performance is improved while the mechanical and thermal properties of the materials used for the thermal management devices and the computing device housing, for example, are maintained. For example, making a surface of a heat pipe black maintains the conductive performance of copper, and making a surface of a computing device housing black maintains the lightweight characteristic of aluminum, while improving the radiative heat transfer. The use of the black coating layers improves radiative efficiencies inside of the computing device (e.g., <1% to >60%), and provides better heat emission and absorption. The use of a black coating layer on an inner surface of the computing device housing also provides more uniform heat spreading, thus preventing hotspots on the computing device housing (e.g., the touch display module and back of the housing).

As an example, the improved heat dissipation within a computing device may be implemented by providing a housing and a thermal management device positioned within the housing, at a distance from a portion of the inner surface of the housing. The housing includes an inner surface and an outer surface. The portion of the inner surface of the housing has a first emissivity. The thermal management device includes an outer surface. The outer surface of the thermal management device includes a first portion and a second portion. The first portion of the outer surface of the thermal management device has a second emissivity, and the second portion of the outer surface of the thermal management device has a third emissivity. The second emissivity is greater than the third emissivity, and the first emissivity is substantially the same as the second emissivity.

Such heat dissipation apparatuses or systems have several potential end-uses or applications, including any electronic device having a passive or an active cooling component (e.g., fan). For example, the heat dissipation apparatus may be incorporated into personal computers, server computers, tablet or other handheld computing devices, laptop or mobile computers, gaming devices, communications devices such as mobile phones, multiprocessor systems, microprocessor-based systems, set top boxes, programmable consumer electronics, network PCs, minicomputers, mainframe computers, or audio or video media players. In certain examples, the heat dissipation apparatus may be incorporated within a wearable electronic device, where the device may be worn on or attached to a person's body or clothing. The wearable device may be attached to a person's shirt or jacket; worn on a person's wrist, ankle, waist, or head; or worn over their eyes or ears. Such wearable devices may include a watch, heart-rate monitor, activity tracker, or head-mounted display.

Using one or more of these features described in greater detail below, improved heat dissipation may be provided for the electronic device. With the improved heat dissipation feature, a more powerful microprocessor may be installed for the electronic device, a thinner electronic device may be designed, a higher processing speed may be provided, or a combination thereof may be provided when compared to a similar electronic device without one or more of the improved heat dissipation features. In other words, the heat dissipation features described herein may provide improved thermal management for an electronic device such as a mobile phone, tablet computer, or laptop computer.

Figure 1:
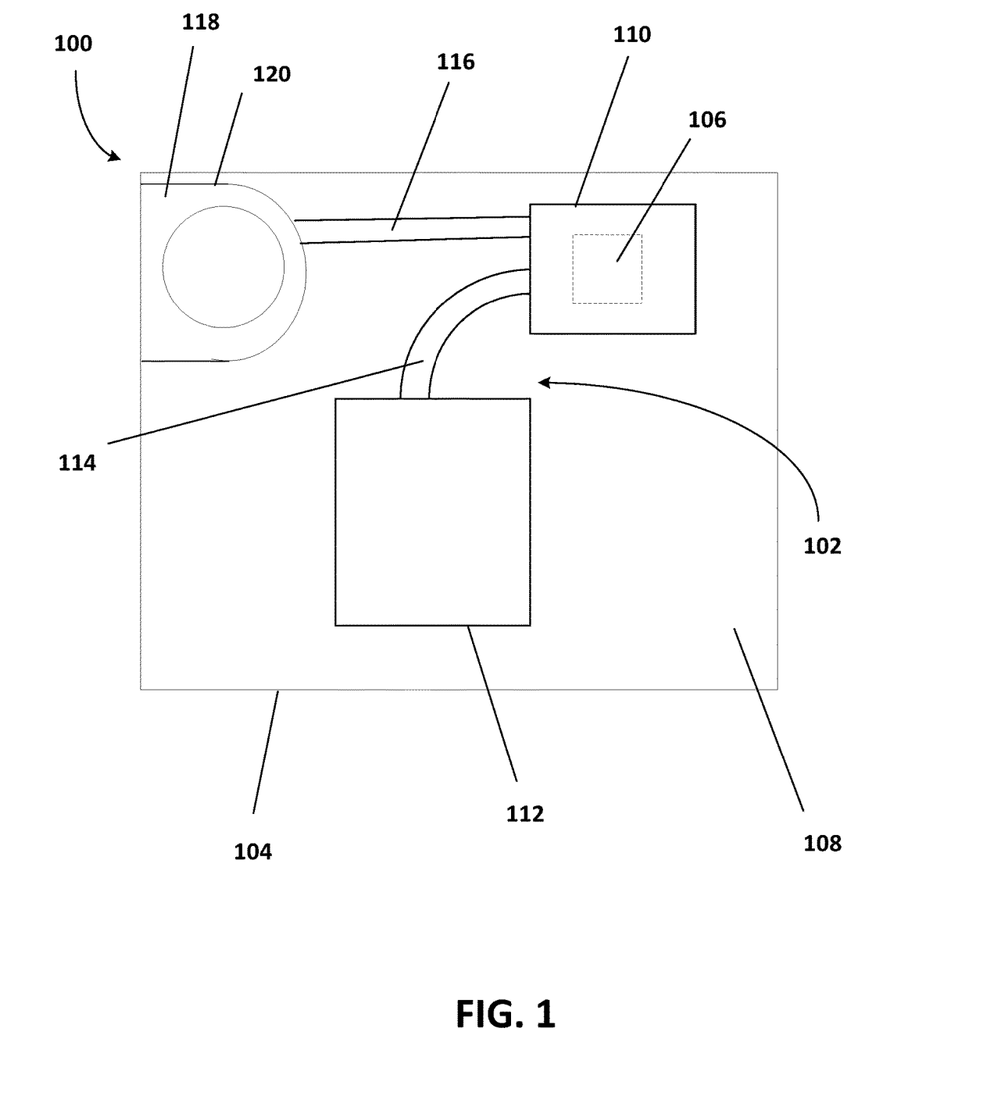
FIG. 1 depicts a top view of a computing device including an example of a thermal management system.

FIG. 1 shows a top view of a computing device 100 including an example of a thermal management system 102. The computing device 100 may be any number of computing devices including, for example, a personal computer, a server computer, a tablet or other handheld computing device, a laptop or mobile computer, a communications device such as a mobile phone, a multiprocessor system, a microprocessor-based system, a set top box, a programmable consumer electronic device, a network PC, a minicomputer, a mainframe computer, or an audio and/or video media player.

The computing device 100 includes a housing 104 that supports at least the thermal management system 102 and a heat generating component 106. The heat generating component 106 may be any number of electrically powered devices including, for example, a processor, memory, a power supply, a graphics card, a hard drive, or another electrically powered device. The heat generating component 106 (e.g., a processor) may be supported by the housing 104 via, for example, a printed circuit board (PCB) 108 attached to and/or supported by the housing 104. The processor 106 is in communication with other electrical devices or components of the computing device 100 via the PCB 108, for example. The computing device 100 may include a number of components not shown in FIG. 1 (e.g., a hard drive, a power supply, connectors).

The processor 106 is electromagnetically shielded by a shield 110. The shield 110 may be any number of shapes including, for example, rectangular and may be made of any number of materials including, for example, copper. The shield 110 may reduce the coupling of electromagnetic fields and radio waves. The amount of reduction depends on, for example, the material used, thickness of the material used, and a size of a shielded volume.

The thermal management system 102 includes a passive thermal module 112 (e.g., a heat spreader) and at least one phase change device 114. In the example shown in FIG. 1, the thermal management system 102 includes a first phase change device 114 and a second phase change device 116. First ends of the first phase change device 114 and the second phase change device 116, respectively, are in physical contact with and/or are adjacent to the processor 106. In one example, the first ends of the first phase change device 114 and the second phase change device are physically attached to a surface of the processor 106 via a layer of thermal adhesive.

The first phase change device 114 extends away from the processor 106, through an opening in the shield 110, to the heat spreader 112 at a second end of the first phase change device 114. The first phase change device 114 moves heat away from the processor 106 and towards the heat spreader 112. The second phase change device 116 extends away from the processor 106, through an opening in the shield 110, to a fan 118 (e.g., a fan housing 120) at a second end of the second phase change device 116. One or more components of the thermal management system 102 are attached to the housing 104 in any number of ways including, for example, using one or more connectors (e.g., screws, flanges, tabs).

The first phase change device 114 and the second phase change device 116 may each be a heat pipe, a vapor chamber, or a combination thereof. The first phase change device 114 and the second phase change device 116 may be made of any number of materials including, for example, copper, aluminum, titanium, another thermally conducting material, or any combination thereof. The internal structure of a heat pipe or vapor chamber is important for phase change performance. Features that affect phase change performance include vapor space and capillary features. The vapor space is a path for evaporated working fluid to travel to a condenser, and the capillary features are a pathway for condensed working fluid to return to an evaporator.

The second end of the first phase change device 114 is physically attached to the heat spreader 112. The second end of the first phase change device 114 may be physically attached to the heat spreader in any number of ways including, for example, with an adhesive (e.g., a thermal adhesive), with solder, by a press fit, with one or more connectors (e.g., screws, nut/bolt combinations), or any combination thereof. In one example, the first phase change device 114 and the heat spreader 112 are manufactured as a single component (e.g., 3D printed as a single component). In one example, the heat spreader 112 is a solid piece of thermally conductive material. For example, the heat spreader 112 may be a solid piece of copper, aluminum, or another thermally conductive material. In another example, the heat spreader 112 is an extension of the first phase change device 114, in that the vapor space of the first phase change device 114 extends into the heat spreader 110.

The heat spreader 112 may be any number of dimensions. The dimensions of the heat spreader 112 may be determined by the size of the device in which the heat spreader 112 is used. The greater the surface area of the heat spreader 112, the better the radiative heat transfer from the heat spreader 112. The heat spreader 112 may also aid in the prevention of hot spots and/or provide for more uniform temperatures within the computing device 100, as, in combination with the first phase change device 114, the heat spreader 112 helps move and keep heat away from the heat generating processor 106.

The second end of the second phase change device 116 is physically attached to the fan housing 120. The second end of the second phase change device 116 may be physically attached to the fan housing 120 in any number of ways including, for example, with an adhesive (e.g., a thermal adhesive), with solder, by a press fit (e.g., a friction fit between the second phase change device 116 and a recess in the fan housing 120), with one or more connectors (e.g., screws, nut/bolt combinations), or any combination thereof. In one example, the second phase change device 116 and the fan housing 120 are manufactured as a single component (e.g., 3D printed as a single component). The fan housing 120 may be made of any number of thermally conductive materials including, for example, copper, aluminum, or another thermally conductive material. In one example, the fan housing 120 is made of plastic.

The second phase change device 116 moves heat away from the processor 106 and towards the fan 118. The fan 118 actively cools the second phase change device 116, moving heat out of he computing device 100 via vents in the housing 104 of the computing device 100. In other examples, the computing device 100 includes additional fans, and additional phase change devices extend from the processor 106 to housings of the additional fans, respectively.

The computing device 100 and/or the thermal management system 102 may include more and/or different components. In one example, the thermal management system 102 also includes one or more heat sinks. For example, the heat spreader 112, the first phase change device 114, the second phase change device 116, another device, or any combination thereof may include a plurality of fins extending away from the heat spreader 112, the first phase change device 114, the second phase change device 116, the other device, or the combination thereof. The plurality of fins may be made of any number of thermally conductive materials including, for example, copper, aluminum, or titanium. The plurality of fins may be physically connected to the heat spreader 112, the first phase change device 114, or the second phase change device 116, for example, via a layer of thermal adhesive (e.g., thermal paste).

These components of the computing device 100 (e.g., the shield 110, the heat spreader 112, the first phase change device 114, the second phase change device 116, and the fan housing 120) may all be made of materials with low emissivity (e.g., copper or aluminum). Use of these materials provides a low radiative heat transfer efficiency between the thermal management devices and the housing 104, and ultimately out of the computing device 100. In such cases, radiative heat transfer within the computing device is an insignificant factor in the heat removal from the processor, for example.

Coating layers (e.g., black coating layers) are applied to one or more of the components of the thermal management system 102 (e.g., the heat spreader 112, the first phase change device 114, the second phase change device 116, and the fan housing 120) to improve radiative heat transfer from the components. A coating layer is also applied to a portion of an inner surface of the housing 104 of the computing device 100 to improve heat transfer between the components of the thermal management system 102 and the housing 104 of the computing device 100, and ultimately out of the computing device 100.

Figure 2:
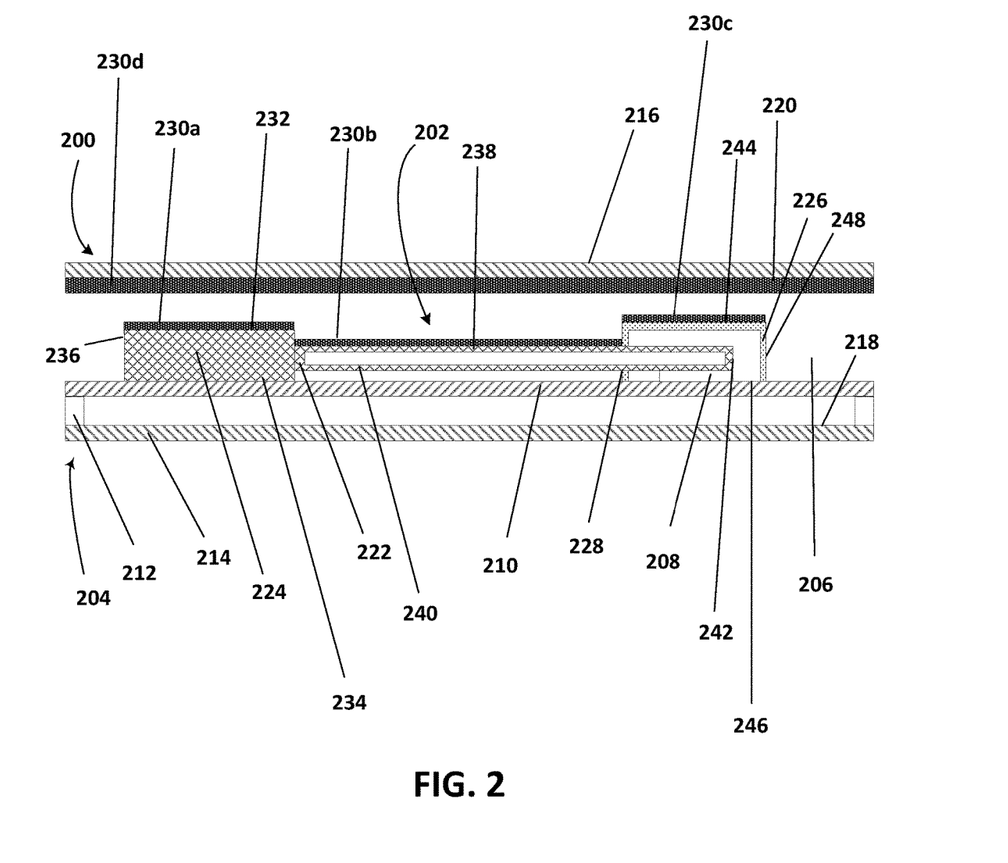
FIG. 2 depicts a cross section of a portion of a computing device including an example of a thermal management system.

FIG. 2 depicts a cross section of a portion of a computing device 200 including an example of a thermal management system 202 including coating layers. The cross section shown in FIG. 2 may depict a cross section of a portion of the thermal management system 102 of FIG. 1 or another thermal management system.

The computing device 200 includes a housing 204 that defines an inner volume 206, in which a heat generating component 208 (e.g., a processor) is supported by a PCB 210. In the example shown in FIG. 2, the PCB 210 is connected to the housing 204 with connectors 212. The PCB 210 may be supported by and/or fixed to the housing 204 in any number of ways including, for example, with tabs, flanges, connectors, an adhesive, or any combination thereof.

The housing 204 includes a chassis 214 (only a portion shown). In the example shown in FIG. 2, the housing 204 also includes a display housing 216 (e.g., of a touch display module; only a portion shown). Only a portion of the display housing 216 is shown in FIG. 2. The display housing 216 abuts the chassis 214, such that an inner surface 218 of the chassis 214 and an outer surface 220 of the display housing 216 form the inner volume 206.

The thermal management system 202 extends away from the processor 208, for example, such that heat is moved away from the processor 208 to cooler parts of the computing device 200. The thermal management system 202 includes at least a phase change device 222 (e.g., a heat pipe) that extends from the processor 208, to a heat spreader 224. The heat pipe 222 is physically attached to or is adjacent to the processor 208. In one example, the heat pipe 222 is physically attached to the processor 208 via a thermal adhesive. The thermal management system 202 may include more, fewer, and/or different components. For example, the thermal management system 202 may include more than one phase change device (e.g., two phase change devices), a fan, and one or more heat sinks. The components of the thermal management system 202 (e.g., the phase change device 222 and the heat spreader 224) may be physically attached to and/or supported by the housing 204, the display housing 216, the PCB 210, or any combination thereof.

The processor 208 is housed within a shield 226 for electromagnetic interference (EMI) purposes. The shield 226 is supported by the PCB 210 and surrounds the processor 208. The shield 226 may include one or more openings or apertures. For example, the shield 226 includes an opening 228 through which the heat pipe 222 extends.

A plurality of coating layers 230 are disposed on surfaces within the computing device 200 to improve radiative heat transfer between components within the housing 204 and the housing 204. For example, a coating layer 230a is disposed on the heat spreader 224, a coating layer 230b is disposed on the heat pipe 222, a coating layer 230c is disposed on the shield 226, and a coating layer 230d is disposed on the outer surface 220 of the display housing 216. In one example the coating layer 230d is disposed on the inner surface 218 of the chassis 214, and some or all of the components supported by the PCB 210 (e.g., the processor 208, the shield 226, the heat pipe 222, and the heat spreader 224) face the inner surface 218 of the chassis 214, not the display housing 216. Additional coating layers 230 may be disposed on additional components within the computing device 200. For example, coating layers 230 may be disposed on a fan housing and one or more additional phase change devices (e.g., a second phase change device).

The heat spreader 224 may be rectangular (e.g., with curved sides) and includes a first side 232 (e.g., a top, a first portion), a second side 234 (e.g., a bottom, a second portion), and at least one third side 236 that extends between the first side 232 and the second side 234. In other examples, the heat spreader 224 may be other shapes including, for example, cylindrical. The coating layer 230a is disposed on the first side 232 of the heat spreader 224. In other examples, the coating layer 230a extends past the first side 232 and onto the at least one third side 236. In the example shown in FIG. 2, the coating layer 230a covers the entire first side 232. In other examples, the coating layer 230a partially covers the first side 232. In one example, the heat spreader 224 does not include any flat surfaces on the top 232 or the bottom 234 (e.g., is cylindrical). In such an example, the coating layer 230a covers a first portion of the heat spreader 224 that is closer to outer surface 220 of the display housing 216, for example, than a second portion of the heat spreader 224. In other words, the coating layer 230a may cover less than half of an outer perimeter of the heat spreader 224. In one example, the coating layer 230a covers the entire outer surface of the heat spreader 224.

At least the second side 234 of the heat spreader 224 may not include a coating layer. In the example shown in FIG. 2, the heat spreader 224 is supported by the PCB 210. In other examples, the heat spreader 224 is not supported by the PCB 210, and the second side 234 of the heat spreader 224 is exposed to the inner surface 218 of the chassis 214. To minimize radiative heat transfer between the heat spreader 224 and/or the PCB 210, and the chassis 214, a coating layer having a low emissivity (e.g., a layer of white, reflective material) may be disposed on the second side 234 of the heat spreader 224, a side of the PCB 210 facing the chassis 214, the inner surface 218 of the chassis 214, or any combination thereof. This would reduce the touch temperature of the chassis as less heat would be dissipated.

The heat pipe 222 may be a flat heat pipe (e.g., with curved sides) and includes a first side 238 (e.g., a top, a first portion), a second side 240 (e.g., a bottom, a second portion) and at least one third side 242 that extends between the first side 238 and the second side 240. In other examples, the heat pipe 222 may be other shapes including, for example, cylindrical. The coating layer 230b is disposed on the first side 238 of the heat pipe 222. In other examples, the coating layer 230b extends past the first side 238 and onto the third side 242. In the example shown in FIG. 2, the coating layer 230b covers the entire first side 238. In other examples, the coating layer 230b partially covers the first side 238. In one example, the heat pipe 222 does not include any flat surfaces on the top 238 or the bottom 240 (e.g., is cylindrical). In such an example, the coating layer 230b covers a first portion of the heat pipe 222 that is closer to the outer surface 220 of the display housing 216, for example, than a second portion of the heat pipe 222. In other words, the coating layer 230b may cover less than half of an outer perimeter of the heat pipe 222. In one example, the coating layer 230b covers the entire outer surface of the heat pipe 222.

In one example, at least the second side 240 of the heat pipe 222 does not include a coating layer. In the example shown in FIG. 2, the heat pipe 222 is positioned between the PCB 210 and the display housing 216. In other examples, the second side 240 of the heat pipe 222 is exposed to the inner surface 218 of the chassis 214. To minimize radiative heat transfer between heat pipe 222 and the chassis 214, for example, a coating layer having a low emissivity (e.g., a layer of white, reflective material) may be disposed on the second side 240 of the heat pipe 222.

The shield 226 may be rectangular and may include a first side 244 (e.g., a top, a first portion), a second side 246 (e.g., a bottom, a second portion), and at least one third side 248 that extends between the first side 244 and the second side 246. In other examples, the shield 226 may be other shapes including, for example, cylindrical. The coating layer 230c is disposed on the first side 244 of the shield 226. In other examples, the coating layer 230c extends past the first side 244 and onto the third side 248. In the example shown in FIG. 2, the coating layer 230c covers the entire first side 244. In other examples, the coating layer 230c partially covers the first side 244. In one example, the shield 226 does not include any flat surfaces on the top 244 or the bottom 246 (e.g., is cylindrical). In such an example, the coating layer 230c covers a first portion of the shield 226 that is closer to the outer surface 220 of the display housing 216, for example, than a second portion of the shield 226. In other words, the coating layer 230c may cover less than half of an outer perimeter of the shield 226. In one example, the coating layer 230c covers the entire outer surface of the shield 226.

In the example shown in FIG. 2, the coating layer 230d is disposed on the outer surface 220 of the display housing 216. During operation of the computing device 200, an operating temperature of the display module may not reach a maximum temperature for the display module. This allows for more radiative heat transfer from the thermal management system 202, for example, to the display module without significantly affecting operation of the display module. This enables higher operating performance of the computing device 200 as an operating temperature of the computing device 200 is lower; more heat is being dissipated across the entire computing device 200 through radiative heat transfer.

The plurality of coating layers 230 improve radiative efficiency by decreasing radiative resistances within the computing device 200. This allows heat to be more readily emitted from and absorbed by the components of the thermal management system 202 and the display module, respectively. The use of the coating layer 230d on the outer surface 220 of the display housing 216 also provides a more evenly distributed temperature profile within the display module. The coating layer 230d also provides better heat spreading above the heat spreader 224, as more heat is dissipated from the heat spreader 224 and absorbed by the display module (e.g., the coating layer 230d).

The plurality of coating layers 230 may be black layers. For example, the plurality of coating layers 230 are layers of black paint, layers of black tape, physical vapor depositions, chemical vapor depositions, anodization layers, another layer of black material, or any combination thereof. In other examples, the plurality of coating layers are not black. The plurality of coating layers 230 may be layers of material with high emissivity in infrared. For example, depending on a maximum allowable temperature of the display module, the emissivity of one or more components of the thermal management system 202 (e.g., the heat pipe 222), for example, may be increased but not maximized by using non-black paint or tape (e.g., yellow or red paint). Emissivities for the plurality of coating layers 230a, 230b, 230c, and 230d may be substantially the same (e.g., between 0.95 and 0.99). The emissivities for the plurality of coating layers 230a, 230b, 230c, and 230d may be greater than the emissivities of the materials of which the components of the thermal management system 202 are made (e.g., copper and aluminum). In another example, some or all coating layers of the plurality of coating layers 230a, 230b, 230c, and 230d have different emissivities.

The uniform spreading and increased temperature within the display module, for example, allows the processor 208 and/or other heat generating components to run at a higher power (e.g., 0.5 W higher), thus providing improved performance for the computing device 200. The use of the plurality of coating layers 230 may also result in the decrease of a maximum touch temperature within the chassis 214 as more heat is dissipated to the display module.

In one example, the coating layer 230d is disposed on the inner surface 218 of the chassis 214, not the outer surface 220 of the display housing 216, and some or all components of the thermal management system 202 and/or some or all components supported by the PCB 210 face the chassis 214. Again, the coating layer 230d aids in heat spreading and provides for more uniform temperature distribution along the chassis 214.

Additional surfaces within the computing device 200 may be coated with a coating layer to improve radiative heat transfer between surfaces. For example, the thermal management system 202 may include additional components such as, for example, one or more heat sinks and one or more additional phase change devices (e.g., heat pipes). At least surfaces of the additional components facing the outer surface 220 of the display housing 216 may include a coating layer. In one example, at least surfaces of the additional components facing the inner surface 218 of the chassis 214 include a coating layer.

Figure 3:
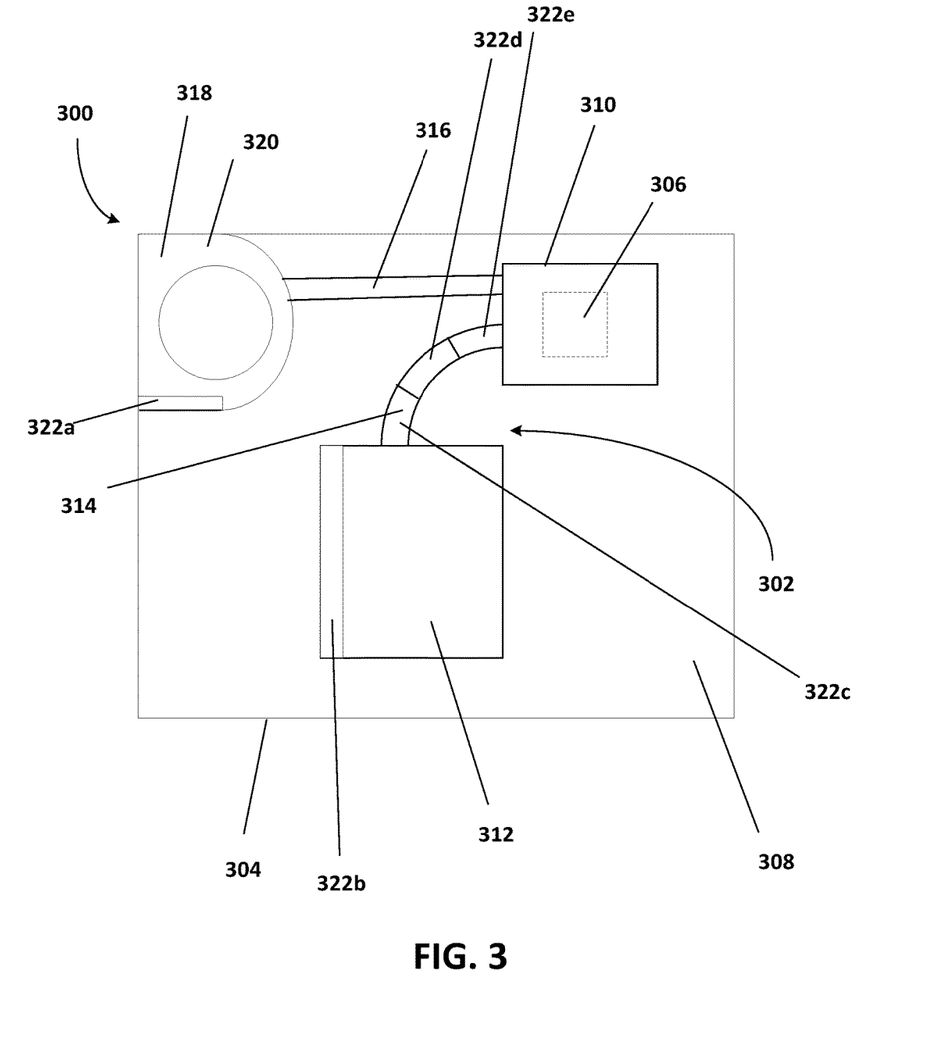
FIG. 3 depicts a top view of a computing device including another example of a thermal management system.

FIG. 3 depicts a top view of a computing device 300 including another example of a thermal management system 302. The computing device 300 includes a housing 304 that supports at least the thermal management system 302 and a heat generating component 306 (e.g., a processor). The processor 306 may be supported by the housing 304 via, for example, a PCB 308 attached to and/or supported by the housing 304.

The processor 306 is electromagnetically shielded by a shield 310. The thermal management system 302 includes a passive thermal module 312 (e.g., a heat spreader) and at least one phase change device 314. In the example shown in FIG. 3, the thermal management system 302 includes a first phase change device 314 and a second phase change device 316. The first phase change device 314 and the second phase change device 316 extend from the processor 306 to the heat spreader 312 and a fan 318 (e.g., a fan housing 320), respectively.

In the example shown in FIG. 3, coating layers 322 are disposed only on sides of the fan housing 320 and the heat spreader 312. The coating layers 322 may be disposed on sides facing a region 324 of the computing device 300. For example, the computing device 300 may include a region 324 that is significantly colder than a region of the computing device 300 in which the processor 306 is disposed (e.g., a cold region). The coating layer 322a disposed on a side of the fan housing 320 and a coating layer 322b disposed on a side of the heat spreader 312 face the cold region 324. Coating layers 322 may also be disposed on surfaces of other components (e.g., the phase change device 314) facing the cold region 322, for example. In one example, one or more of thermal management system components include angled surfaces that face the cold region 322 and/or other regions of the computing device 300, for example, to direct radiative heat towards the cold region 322 and/or the other regions of the computing device 300. These angled, high emissivity surfaces increase the temperature difference, thus improving radiative heat transfer and heat dissipation.

Also as shown in the example of FIG. 3, different types of coating layers 322 may be used at different positions within the computing device 300. For example, coating layers 322c, 322d, and 322e may be positioned at different positions along the first phase change device 314, for example. The coating layers 322c, 322d, and 322e are made of different materials and/or are different colors and have different emissivities. The different materials and/or colors used may be based on emissivity to provide a uniform temperature profile on a surface of and/or in a portion of the housing 304 (e.g., the chassis or the display module). The surface of the housing 304 may also include a plurality of coating layers with different emissivities to provide a uniform temperature profile in the portion of the housing. In other examples, the computing device includes more, fewer, or different coating layers with different emissivities.

In another example, as described above with reference to the computing device 200, top surfaces of one or more of the shield 310, the heat spreader 312, the first phase change device 314, the second phase change device 316, and the fan housing 320 are covered with a coating layer (e.g., a black coating layer) to improve radiative heat transfer between the thermal management system components and a surface of the housing 304 (e.g., the chassis or the display module).

Figure 4:
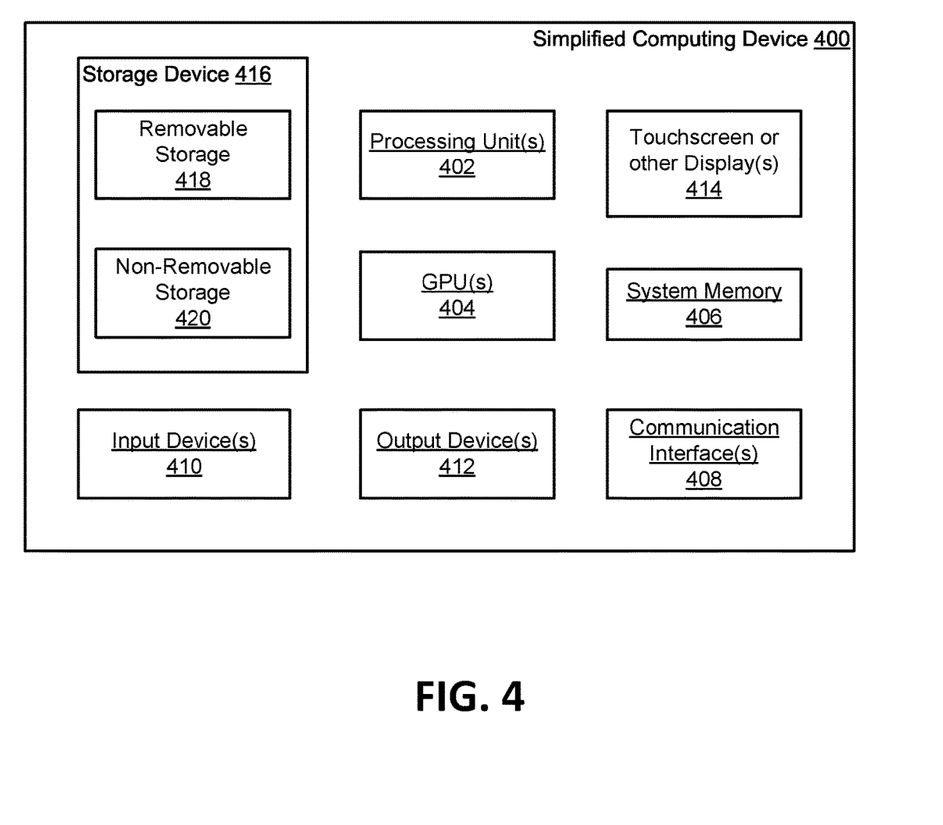
FIG. 4 is a block diagram of a computing environment in accordance with one example for implementation of the disclosed methods or one or more electronic devices.

With reference to FIG. 4, a thermal management system, as described above, may be incorporated within an exemplary computing environment 400. The computing environment 400 may correspond with one of a wide variety of computing devices, including, but not limited to, personal computers (PCs), server computers, tablet and other handheld computing devices, laptop or mobile computers, communications devices such as mobile phones, multiprocessor systems, microprocessor-based systems, set top boxes, programmable consumer electronics, network PCs, minicomputers, mainframe computers, or audio or video media players. For example, the heat dissipating apparatus is incorporated within a computing environment having an active cooling source (e.g., fan).

The computing environment 400 has sufficient computational capability and system memory to enable basic computational operations. In this example, the computing environment 400 includes one or more processing units 402, which may be individually or collectively referred to herein as a processor. The computing environment 400 may also include one or more graphics processing units (GPUs) 404. The processor 402 and/or the GPU 404 may include integrated memory and/or be in communication with system memory 406. The processor 402 and/or the GPU 404 may be a specialized microprocessor, such as a digital signal processor (DSP), a very long instruction word (VLIW) processor, or other microcontroller, or may be a general purpose central processing unit (CPU) having one or more processing cores. The processor 402, the GPU 404, the system memory 406, and/or any other components of the computing environment 400 may be packaged or otherwise integrated as a system on a chip (SoC), application-specific integrated circuit (ASIC), or other integrated circuit or system.

The computing environment 400 may also include other components, such as, for example, a communications interface 408. One or more computer input devices 410 (e.g., pointing devices, keyboards, audio input devices, video input devices, haptic input devices, or devices for receiving wired or wireless data transmissions) may be provided. The input devices 410 may include one or more touch-sensitive surfaces, such as track pads. Various output devices 412, including touchscreen or touch-sensitive display(s) 414, may also be provided. The output devices 412 may include a variety of different audio output devices, video output devices, and/or devices for transmitting wired or wireless data transmissions.

The computing environment 400 may also include a variety of computer readable media for storage of information such as computer-readable or computer-executable instructions, data structures, program modules, or other data. Computer readable media may be any available media accessible via storage devices 416 and includes both volatile and nonvolatile media, whether in removable storage 418 and/or non-removable storage 420. Computer readable media may include computer storage media and communication media. Computer storage media may include both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which may be used to store the desired information and which may accessed by the processing units of the computing environment 400.

Figure 5:
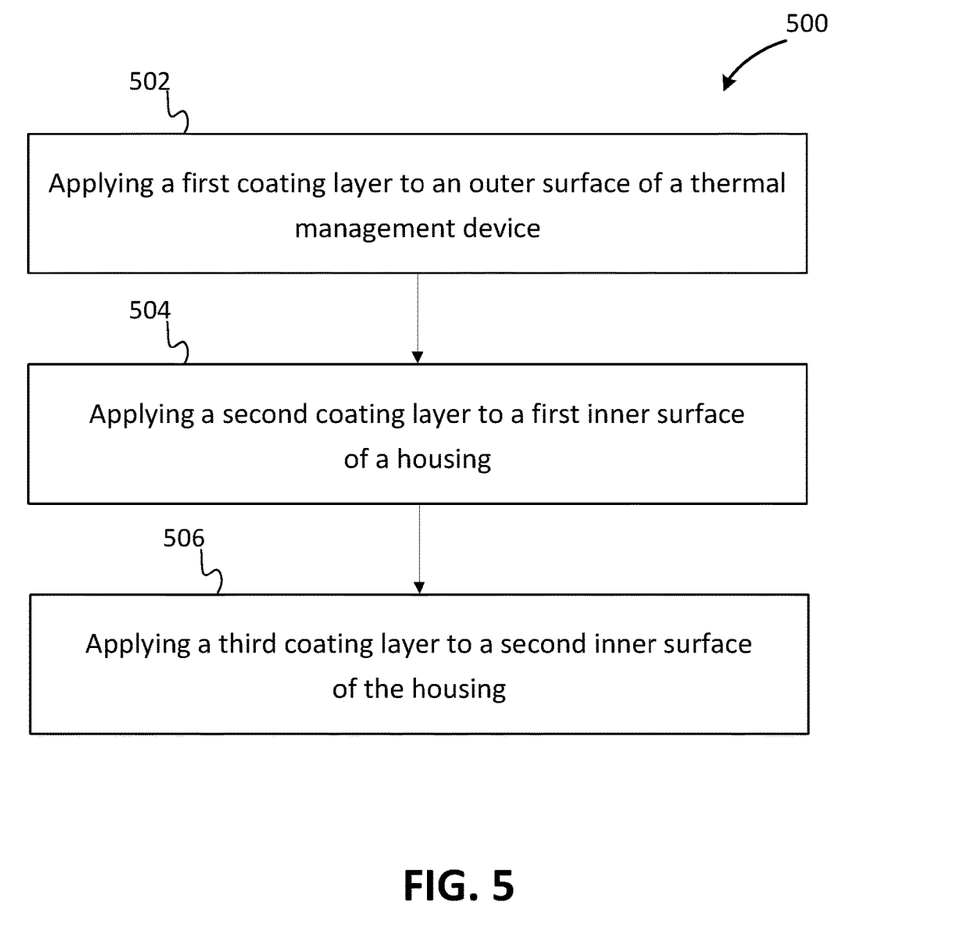
FIG. 5 is a flow diagram of a method for manufacturing a computing device in accordance with one example.

FIG. 5 shows a flowchart of one example of a method 500 for manufacturing a computing device. The computing device may be a computing device shown in FIGS. 1-4 or may be another computing device. The method 500 is implemented in the order shown, but other orders may be used. Additional, different, or fewer acts may be provided. Similar methods may be used for transferring heat.

In act 502, a first coating layer is applied to an outer surface of a thermal management device disposed in the computing device. The thermal management device may be any number of thermal management devices including, for example, a phase change device, a heat spreader, a heat sink, a fan housing, or another thermal management device. The first coating layer has a greater emissivity than the thermal management device (e.g., the outer surface of the thermal management system). In one example, a black coating layer is applied to the outer surface of the thermal management device. The first coating layer may be a layer of black paint, a layer of black tape, a physical vapor deposition, a chemical vapor deposition, an anodization layer, or any combination thereof. Other materials may be used for the first coating layer.

In one example, additional coating layers are applied to the outer surface of the thermal management device. For example, coating layers may be applied to surfaces of the thermal management device that face a region or volume of the computing device (e.g., to aim radiated heat towards the region or volume). In another example, some or all of the coating layers applied to the outer surface of the thermal management device have different emissivities. Additional coating layers (e.g., black coating layers) may be applied to other components (e.g., other thermal management devices) within the computing device.

In act 504, a second coating layer is applied to a first inner surface of a housing of the computing device. The first inner surface of the housing may be formed by an inner surface of a chassis of the computing device or may be formed by an outer surface of a display housing (e.g., a touch display housing). The second coating layer has a greater emissivity than the first inner surface of the housing (e.g., the inner surface of the chassis or the outer surface of the display housing). In one example, a black coating layer is applied to the first inner surface of the housing. The second coating layer may be a layer of black paint, a layer of black tape, a physical vapor deposition, a chemical vapor deposition, an anodization layer, or any combination thereof. Other materials may be used for the second coating layer. The second coating layer may cover an entire surface of the housing (e.g., a surface opposite and/or parallel to a PCB supporting a heat generating component to be cooled by the thermal management system). In another example, the second coating layer covers less than the entire first inner surface of the housing.

In one example, a plurality of coating layers are applied to the first inner surface of the housing. In one example, some or all of the coating layers applied to the first inner surface of the housing have different emissivities. Additional coating layers (e.g., black coating layers) may be applied to other surfaces of the housing within the computing device.

In act 506, a third coating layer is applied to a second inner surface of the housing of the computing device. The second inner surface of the housing may be formed by the outer surface of the display housing or the inner surface of the chassis of the computing device. The second inner surface of the housing may face a side of the PCB furthest away from the heat generating component to be cooled. The third coating layer has a lower emissivity compared to the first coating layer and the second coating layer. In one example, a white, reflective coating layer is applied to the first second surface of the housing. The second coating layer may be a layer of white glossy paint, a layer of white tape, a layer of another white, reflective material, or any combination thereof. Other materials may be used for the third coating layer. The third coating layer may cover an entire surface of the housing. In another example, the third coating layer covers less than the entire second inner surface of the housing.

While the present claim scope has been described with reference to specific examples, which are intended to be illustrative only and not to be limiting of the claim scope, it will be apparent to those of ordinary skill in the art that changes, additions and/or deletions may be made to the disclosed embodiments without departing from the spirit and scope of the claims.

The foregoing description is given for clearness of understanding only, and no unnecessary limitations should be understood therefrom, as modifications within the scope of the claims may be apparent to those having ordinary skill in the art.

In a first embodiment, a computing device includes a housing. The housing includes an inner surface. A portion of the inner surface of the housing has a first emissivity. The computing device also includes a thermal management device positioned within the housing, at a distance from the portion of the inner surface of the housing. The thermal management device includes an outer surface. The outer surface of the thermal management device includes a first portion and a second portion. The first portion of the outer surface of the thermal management device has a second emissivity, and the second portion of the outer surface of the thermal management device has a third emissivity. The second emissivity is greater than the third emissivity, and the first emissivity is substantially the same as the second emissivity.

In a second embodiment, with reference to the first embodiment, the thermal management device includes a phase change device, a heat spreader, a fan housing, a heat sink, or any combination thereof.

In a third embodiment, with reference to the second embodiment, the computing device further includes a heat generating component positioned within the housing. The thermal management device includes the phase change device and the heat spreader. The phase change device extends away from the heat generating component to the heat spreader, such that the heat spreader is physically and thermally connected to the heat generating component.

In a fourth embodiment, with reference to the second embodiment, the portion of the inner surface of the housing is formed by a first layer of black material, and the first portion of the outer surface of the thermal management device is formed by a second layer of black material.

In a fifth embodiment, with reference to the fourth embodiment, the first layer of black material includes a layer of black paint, a layer of black tape, a physical vapor deposition, a chemical vapor deposition, an anodization layer, or any combination thereof. The second layer of black material includes a layer of black paint, a layer of black tape, a physical vapor deposition, a chemical vapor deposition, an anodization layer, or any combination thereof.

In a sixth embodiment, with reference to the fourth embodiment, the computing device further includes a display housing. The display housing partially forms the inner surface of the housing. The first layer of black material is disposed on the display housing.

In a seventh embodiment, with reference to the sixth embodiment, the portion of the inner surface of the housing is a first portion of the inner surface of the housing. The inner surface of the housing includes a second portion. The second portion of the inner surface of the housing is opposite and at a distance from the first portion of the inner surface of the housing. The second portion of the inner surface of the housing has a fourth emissivity. The fourth emissivity is less than the first emissivity and the second emissivity.

In an eighth embodiment, with reference to the fourth embodiment, the portion of the inner surface is a first portion of the inner surface. The computing device further includes a display housing. The display housing forms a second portion of the inner surface. The second portion of the inner surface is at a distance from and opposite the first portion of the inner surface.

In a ninth embodiment, a thermal management device includes a phase change device including an outer surface. The outer surface of the phase change device has a first emissivity. The thermal management device also includes a first coating layer disposed on the outer surface of the phase change device. The first coating layer has a second emissivity. The thermal management device includes a second coating layer disposed on the outer surface of the phase change device, at a distance from the first coating layer. The second coating layer has a third emissivity. The second emissivity and the third emissivity are greater than the first emissivity.

In a tenth embodiment, with reference to the ninth embodiment, the second emissivity is substantially the same as the third emissivity.

In an eleventh embodiment, with reference to the ninth embodiment, the second emissivity is different than the third emissivity.

In a twelfth embodiment, with reference to the ninth embodiment, the phase change device includes a heat pipe or a vapor chamber.

In a thirteenth embodiment, with reference to the twelfth embodiment, the first coating layer faces a different direction than the second coating layer.

In a fourteenth embodiment, with reference to the twelfth embodiment, the phase change device includes a top, a bottom, a first side, and a second side. The first coating layer is disposed on at least the first side or the second side, and the second coating layer is disposed on at least the first side or the second side.

In a fifteenth embodiment, with reference to the ninth embodiment, the first coating layer includes a layer of black paint, a layer of black tape, a physical vapor deposition, a chemical vapor deposition, an anodization layer, or any combination thereof. The second coating layer includes a layer of black paint, a layer of black tape, a physical vapor deposition, a chemical vapor deposition, an anodization layer, or any combination thereof.

In a sixteenth embodiment, a computing device includes a housing including an inner surface, and a computer component positioned within the housing. The computer component includes an outer surface. The outer surface of the computer component includes a first portion and a second portion. The computing device also includes a first coating layer disposed on the inner surface of the housing. The first coating layer has a first emissivity, and the first portion of the outer surface of the computer component has a second emissivity. The computing device includes a second coating layer disposed on the second portion of the outer surface of the computer component. The second coating layer has a third emissivity. The first emissivity and the third emissivity are greater than the second emissivity.

In a seventeenth embodiment, with reference to the sixteenth embodiment, the first emissivity and the third emissivity are substantially the same.

In an eighteenth embodiment, with reference to the seventeenth embodiment, the first coating layer includes a layer of black paint, a layer of black tape, a physical vapor deposition, a chemical vapor deposition, an anodization layer, or any combination thereof. The second coating layer includes a layer of black paint, a layer of black tape, a physical vapor deposition, a chemical vapor deposition, an anodization layer, or any combination thereof.

In a nineteenth embodiment, with reference to the sixteenth embodiment, the computer component includes an electromagnetic shield, a heat spreader, a phase change device, a heat sink, or any combination thereof.

In a twentieth embodiment, with reference to the sixteenth embodiment, the housing includes a chassis and a display housing. The first coating layer is disposed on the chassis or the display module.

In connection with any one of the aforementioned embodiments, the thermal management device or the method for manufacturing the thermal management device may alternatively or additionally include any combination of one or more of the previous embodiments.

The foregoing description is given for clearness of understanding only, and no unnecessary limitations should be understood therefrom, as modifications within the scope of the claims may be apparent to those having ordinary skill in the art.

The invention claimed is:

1. A computing device comprising:
a housing having an inner surface;
a heat generating component positioned within the housing;
a first coating layer disposed on the inner surface of the housing, the first coating layer having a first emissivity;
a thermal management device positioned within the housing, at a distance from the inner surface of the housing, the thermal management device comprising a phase change device and a heat spreader, the thermal management device having an outer surface, the outer surface of the thermal management device comprising a first portion and a second portion; and a second coating layer disposed on the first portion of the outer surface of the thermal management device, the second coating layer having a second emissivity, wherein the second portion of the outer surface of the thermal management device has a third emissivity, wherein the second emissivity is greater than the third emissivity, and the first emissivity is substantially the same as the second emissivity, and wherein the phase change device extends away from the heat generating component to the heat spreader, such that the heat spreader is physically and thermally connected to the heat generating component.

2. The computing device of claim 1, wherein the thermal management device further comprises a fan housing, a heat sink, or a combination thereof.

3. The computing device of claim 1, wherein the first coating layer comprises a layer of black paint, a layer of black tape, a physical vapor deposition, a chemical vapor deposition, an anodization layer, or any combination thereof, and wherein the second coating layer comprises a layer of black paint, a layer of black tape, a physical vapor deposition, a chemical vapor deposition, an anodization layer, or any combination thereof.

4. The computing device of claim 1, wherein the housing includes a display housing, a surface of the display housing being the inner surface of the housing, wherein the first coating layer is disposed on the display housing.

5. The computing device of claim 4, wherein the inner surface of the housing is a first inner surface of the housing, wherein the housing has a second inner surface opposite and at a distance from the first inner surface of the housing, the second inner surface of the housing having a fourth emissivity, and wherein the fourth emissivity is less than the first emissivity and the second emissivity.

6. The computing device of claim 1, wherein the inner surface is a first inner surface, and wherein the housing comprises a display housing and a chassis, a surface of the display housing or the chassis forming a second inner surface of the housing, the second inner surface being at a distance from and opposite the first inner surface.

7. The computing device of claim 1, wherein the thermal management device includes a first side, a second side opposite the first side, and a third side connecting the first side to the second side, the second coating layer being disposed on the first side, the first side being closer to the inner surface of the housing than the second side and the third side.

8. The computing device of claim 1, wherein the second coating layer is disposed on a side of the thermal management device facing away from the heat generating component.

9. A thermal management device comprising:
a heat pipe comprising an outer surface, the outer surface of the heat pipe having a first emissivity;
a first coating layer disposed on the outer surface of the heat pipe, the first coating layer having a second emissivity; and a second coating layer disposed on the outer surface of the heat pipe, at a distance from the first coating layer, the second coating layer having a third emissivity, wherein the second emissivity and the third emissivity are greater than the first emissivity, and wherein the second emissivity is substantially the same as the third emissivity.

10. The thermal management device of claim 9, further comprising a heat spreader.

11. The thermal management device of claim 10, wherein the heat spreader is an extension of the heat pipe.

12. The thermal management device of claim 11, wherein a vapor space of the heat pipe extends into the heat spreader.

13. The thermal management device of claim 9, wherein the first coating layer faces a different direction than the second coating layer.

14. The thermal management device of claim 9, wherein heat pipe comprises a top, a bottom, a first side, and a second side, and wherein the first coating layer is disposed on at least the first side or the second side, and the second coating layer is disposed on at least the first side or the second side.

15. The thermal management device of claim 9, wherein the first coating layer comprises a layer of black paint, a layer of black tape, a physical vapor deposition, a chemical vapor deposition, an anodization layer, or any combination thereof, and wherein the second coating layer comprises a layer of black paint, a layer of black tape, a physical vapor deposition, a chemical vapor deposition, an anodization layer, or any combination thereof.

16. The computing device of claim 9, wherein the heat pipe includes a first side and a second side opposite the first side, the first coating layer and the second coating layer being disposed only on the first side.

17. A computing device comprising:
a housing having an inner surface;
a heat generating component positioned within the housing;
a thermal management device positioned within the housing and physically connected to the heat generating component, the thermal management device comprising a phase change device having an outer surface, the outer surface of the phase change device having a first emissivity;
a first coating layer disposed on the outer surface of the phase change device, the first coating layer having a second emissivity; and
a second coating layer disposed on the outer surface of the phase change device, at a distance from the first coating layer, the second coating layer having a third emissivity,
wherein the second emissivity and the third emissivity are greater than the first emissivity,
wherein the second emissivity is different than the third emissivity,
wherein the computing device further comprises a third coating layer disposed on the inner surface of the housing, the third coating layer having a fourth emissivity, and
wherein the fourth emissivity and the third emissivity are substantially the same.

18. The computing device of claim 17, wherein the first coating layer comprises a layer of black paint, a layer of black tape, a physical vapor deposition, a chemical vapor deposition, an anodization layer, or any combination thereof, and wherein the second coating layer comprises a layer of black paint, a layer of black tape, a physical vapor deposition, a chemical vapor deposition, an anodization layer, or any combination thereof.

19. The computing device of claim 17, wherein the thermal management device further comprises an electromagnetic shield, a heat spreader, a heat sink, a fan housing, or any combination thereof.

20. The computing device of claim 17, wherein the housing comprises a chassis and a display housing, wherein the third coating layer is disposed on the chassis or the display housing.

21. The computing device of claim 17, wherein the third emissivity is at least 0.95.

* * * * *